(12) United States Patent
Oikawa

(10) Patent No.: US 7,046,540 B2
(45) Date of Patent: May 16, 2006

(54) SEMICONDUCTOR INTEGRATED CIRCUIT DEVICE AND INFORMATION STORAGE METHOD THEREFOR

(75) Inventor: Kohei Oikawa, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 111 days.

(21) Appl. No.: 10/742,837

(22) Filed: Dec. 23, 2003

(65) Prior Publication Data
US 2005/0057955 A1 Mar. 17, 2005

(30) Foreign Application Priority Data
Sep. 12, 2003 (JP) ............................. 2003-321129

(51) Int. Cl.
*G11C 11/22* (2006.01)

(52) U.S. Cl. ...................... 365/145; 365/149; 365/154; 365/189.05; 365/210

(58) Field of Classification Search ................ 365/145, 365/185.23, 185.2, 149, 154, 189.05, 210
See application file for complete search history.

(56) References Cited

U.S. PATENT DOCUMENTS

| 5,566,114 | A | * | 10/1996 | Pascucci et al. | ............. 365/200 |
| 5,892,718 | A | * | 4/1999 | Yamada | ...................... 365/200 |
| 6,002,856 | A | | 12/1999 | Akao et al. | ............ 395/500.02 |
| 6,320,782 | B1 | | 11/2001 | Takashima | .................. 365/145 |
| 6,657,883 | B1 | * | 12/2003 | Takashima | .................. 365/145 |
| 6,665,226 | B1 | * | 12/2003 | Yoneya et al. | ........... 365/225.7 |

* cited by examiner

*Primary Examiner*—Richard Elms
*Assistant Examiner*—Pho M. Luu
(74) *Attorney, Agent, or Firm*—Oblon, Spivak, McClelland, Maier & Neustadt, P.C.

(57) ABSTRACT

A semiconductor integrated circuit device includes a cell array having a plurality of memory cells, a peripheral circuit which controls the cell array, and an operation information determination circuit. The operation information determination circuit determines either of a first operation mode in which one bit is stored by using one memory cell and a second operation mode in which one bit is stored by using two memory cells, and supplies operation information to the peripheral circuit. The operation information determines which of the first and second operation modes is used to operate the cell array.

16 Claims, 14 Drawing Sheets

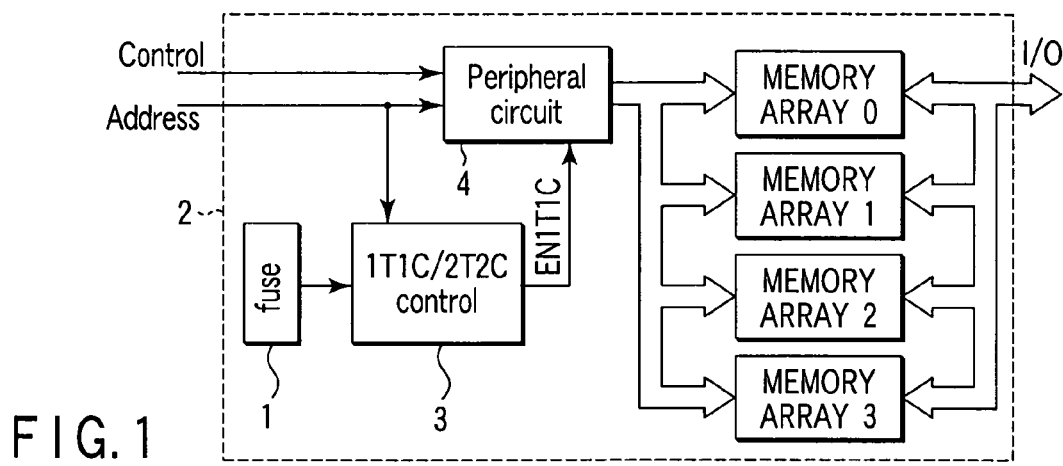
FIG. 1
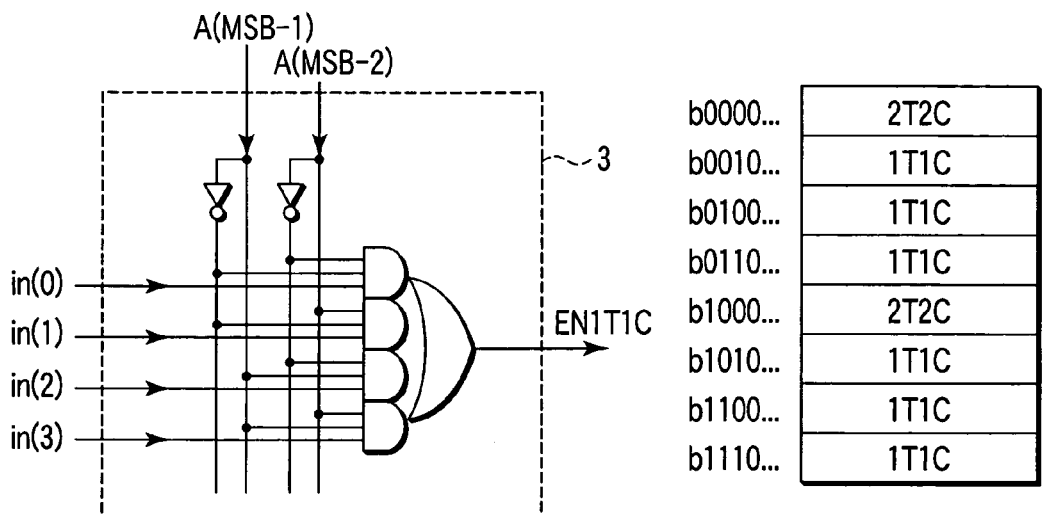
FIG. 2
FIG. 3
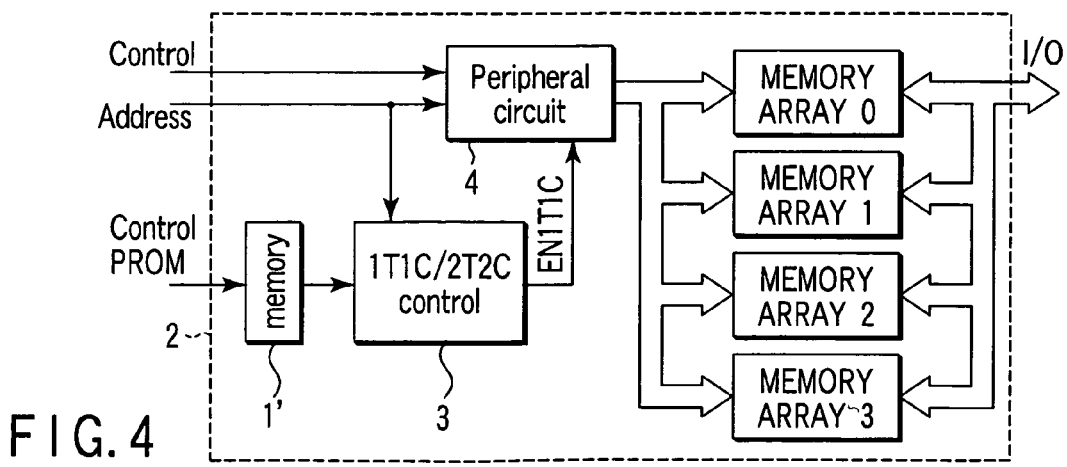
FIG. 4

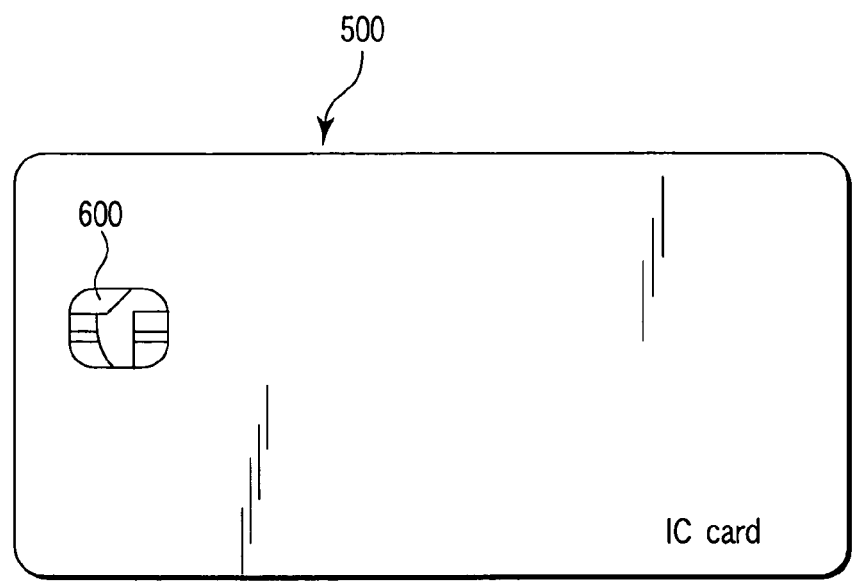
F I G. 16
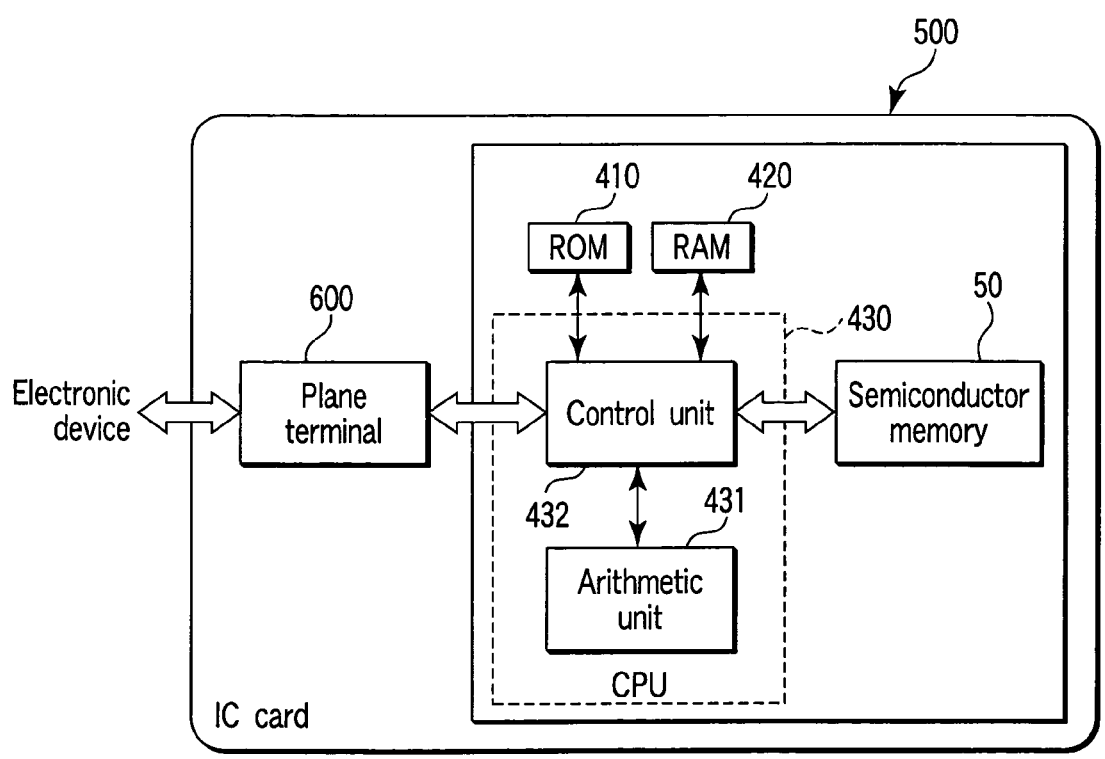
F I G. 17

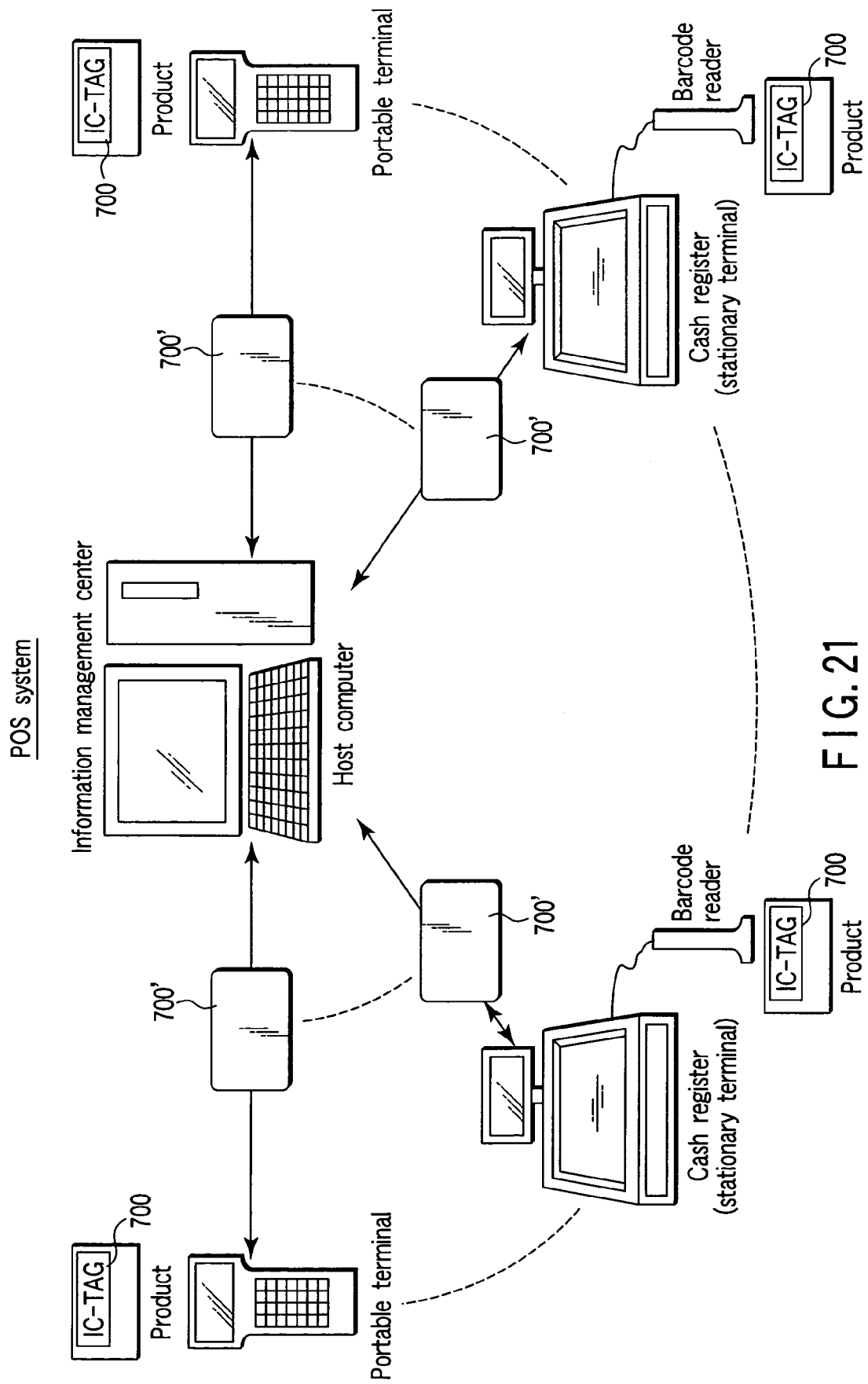
F I G. 21

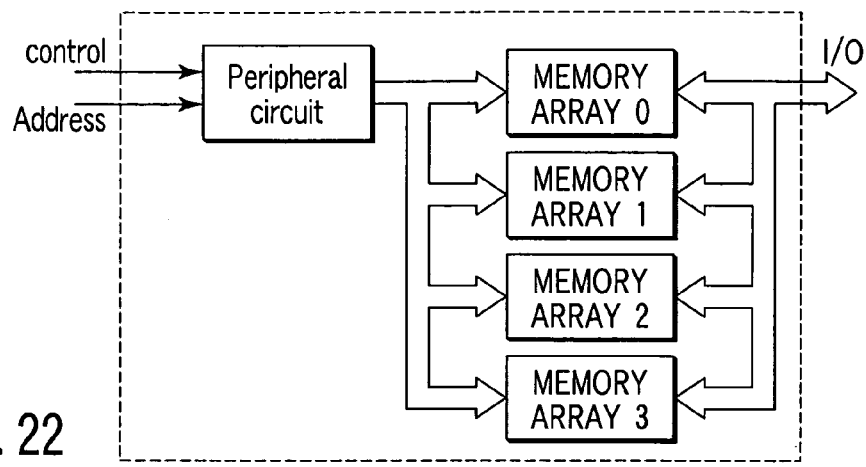
F I G. 22
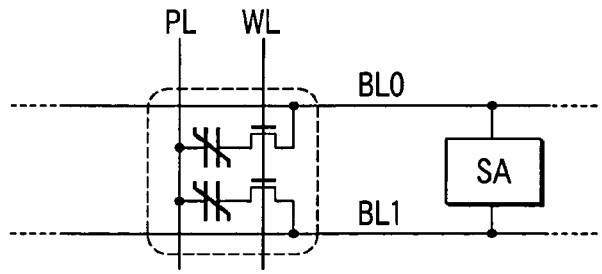
F I G. 23
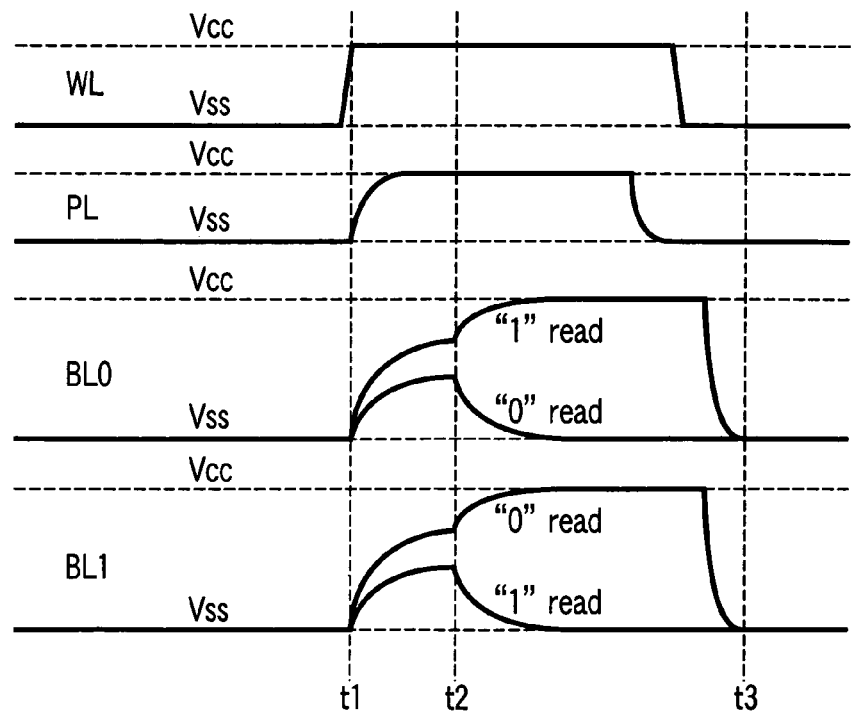
F I G. 24

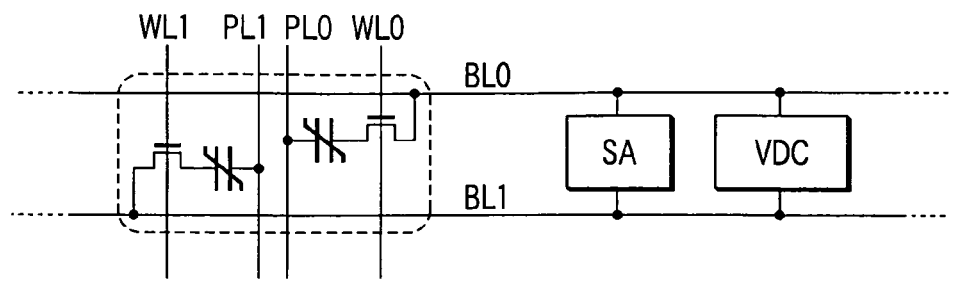
F I G. 25
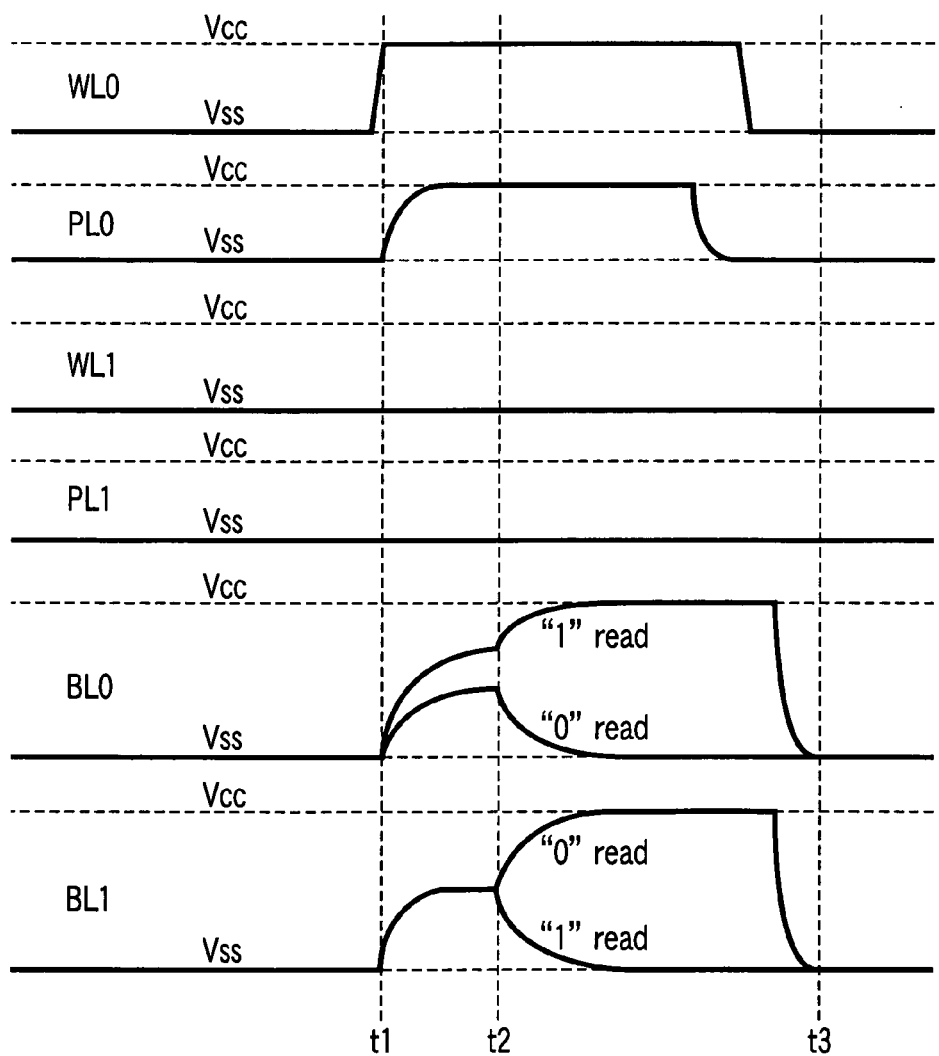
F I G. 26

SEMICONDUCTOR INTEGRATED CIRCUIT DEVICE AND INFORMATION STORAGE METHOD THEREFOR

CROSS-REFERENCE TO RELATED APPLICATIONS

This application is based upon and claims the benefit of priority from the prior Japanese Patent Application No. 2003-321129, filed Sep. 12, 2003, the entire contents of which are incorporated herein by reference.

BACKGROUND OF THE INVENTION

1. Field of the Invention

The present invention relates to a semiconductor integrated circuit device and, more particularly, to a semiconductor integrated circuit device having a nonvolatile semiconductor memory and an information storage method therefor.

2. Description of the Related Art

Recently, electronic devices such as cell phones and IC cards have widely spread. These electronic devices require a nonvolatile semiconductor memory as a recording medium (memory unit). At present, a flash memory is generally used as a nonvolatile semiconductor memory. The flash memory is not suitable in terms of the write speed and random accessibility. For this reason, an SRAM or DRAM is often used as a cash memory together with the flash memory. In this case, the memory unit incorporated in one electronic device is formed by a plurality of types of devices.

A ferroelectric semiconductor memory as one of nonvolatile semiconductor memories has a higher write speed than that of the flash memory, and enables random access. The ferroelectric semiconductor memory, therefore, receives a great deal of attention as a device which allows forming a memory unit incorporated in one electronic device by one type of device. The ferroelectric semiconductor memory is described in, e.g., reference 1: reference 1: U.S. Pat. No. 6,320,782

BRIEF SUMMARY OF THE INVENTION

A semiconductor integrated circuit device according to a first aspect of the present invention comprises: a cell array having a plurality of memory cells; a peripheral circuit which controls the cell array; and an operation information determination circuit which determines either of a first operation mode in which one bit is stored by using one memory cell and a second operation mode in which one bit is stored by using two semiconductor memory cells, and supplies operation information to the peripheral circuit, the operation information determining which of the first and second operation modes is used to operate the cell array.

A semiconductor integrated circuit device according to a second aspect of the present invention comprises: a first memory cell which is connected to a first bit line and a first word line; a second memory cell which is connected to a second bit line and a second word line; an amplifier circuit which amplifies a potential difference between a potential of the first bit line and a potential of the second bit line; a reference potential generation circuit which generates a reference potential; a reference potential supply circuit which selects either of the first and second bit lines, supplies the reference potential to the selected bit line, and stops supply of the reference potential to the first and second bit lines; and a word line driving circuit which selects and drives one or both of the first and second word lines.

A semiconductor integrated circuit device according to a third aspect of the present invention comprises: a first memory cell which is connected to a word line; a second memory cell which is connected to the word line; a first selection transistor which connects the first memory cell to a first bit line; a second selection transistor which connects the second memory cell to a second bit line; an amplifier circuit which amplifies a potential difference between a potential of the first bit line and a potential of the second bit line; a reference potential generation circuit which selects either of the first and second bit lines, supplies a reference potential to the selected bit line, and stops supply of the reference potential to the first and second bit lines; and a selection transistor driving circuit which selects and drives one or both of the first and second selection transistors.

An information storage method for a semiconductor integrated circuit device according to a fourth aspect of the present invention comprises: assigning to the second memory area an information area which is restricted by an operating system, and storing restricted information in the second memory area; and assigning to the first memory area an information area which is not restricted by the operating system, and storing unrestricted information in the first memory area.

An information storage method for a semiconductor integrated circuit device according to a fifth aspect of the present invention comprises: storing confidential information in the first memory area; and storing information other than the confidential information in the second memory area.

BRIEF DESCRIPTION OF THE SEVERAL VIEWS OF THE DRAWING

FIG. 1 is a block diagram showing an arrangement example of a semiconductor integrated circuit device according to the first embodiment of the present invention;

FIG. 2 is a circuit diagram showing a circuit example of a 1T1C/2T2C control;

FIG. 3 is a view showing a memory map;

FIG. 4 is a block diagram showing an arrangement example of a semiconductor integrated circuit device according to the second embodiment of the present invention;

FIG. 16 is a view showing the outer appearance of an example of an IC card according to application 3;

FIG. 17 is a block diagram showing an arrangement example of the IC card according to application 3;

FIG. 21 is a view showing a POS system according to application 7;

FIG. 22 is a block diagram schematically showing the whole arrangement of a ferroelectric semiconductor memory unit;

FIG. 23 is a circuit diagram showing a 2T2C structure;

FIG. 24 is an operation waveform chart showing an operation example of the 2T2C structure;

FIG. 25 is a circuit diagram showing a 1T1C structure; and

FIG. 26 is an operation waveform chart showing an operation example of the 1T1C structure.

DETAILED DESCRIPTION OF THE INVENTION

Figure 5:
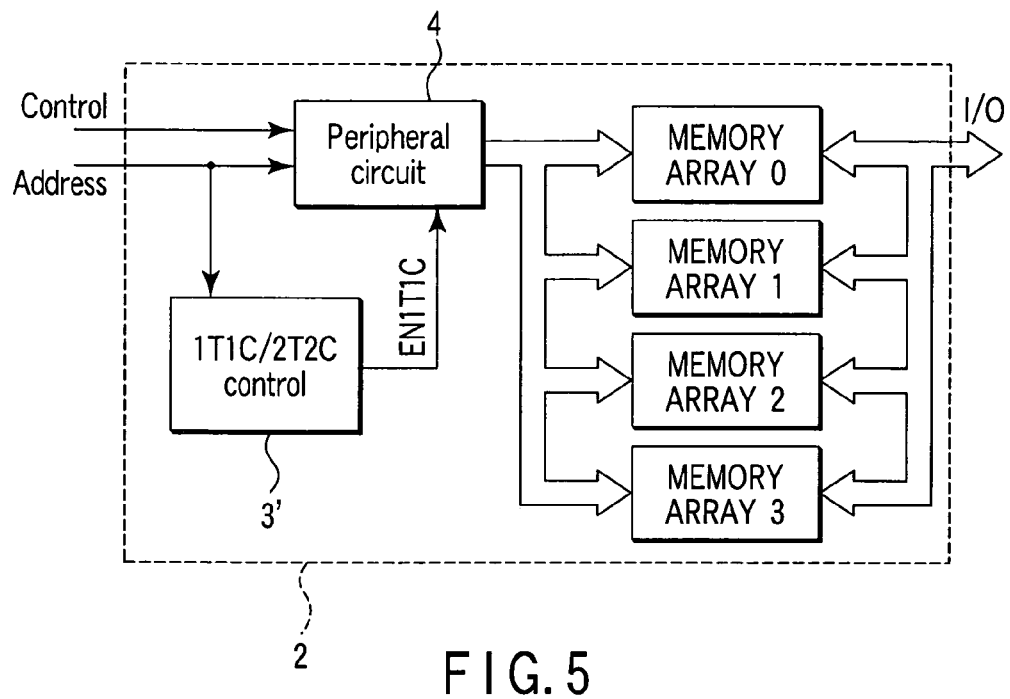
FIG. 5 is a block diagram showing an arrangement example of a semiconductor integrated circuit device according to the third embodiment of the present invention.

Prior to a description of embodiments, an example of improper information estimation and a cell structure example of a ferroelectric semiconductor memory will be explained.

For example, the ferroelectric semiconductor memory changes in performance and information confidentiality depending on the cell structure. This may pose a problem when a memory unit incorporated in one electronic device is formed by one type of device.

In recent years, the security of electronic devices becomes important. For example, secret data such as personal information may be recorded on an IC card, and the information security technique must be improved.

Recently, as a method of analyzing secret data recorded on an IC card or the like, current consumption in an IC card is undesirably analyzed to estimate recorded information. If current consumption in operation changes depending on information contents in a nonvolatile semiconductor memory, this may be a weak point in security.

FIG. 22 is a block diagram schematically showing the whole arrangement of a ferroelectric semiconductor memory unit.

A peripheral circuit in the unit controls a plurality of memory cell arrays in accordance with a control signal and address signal. The cell array includes a plurality of memory cells.

FIG. 23 shows a 2T2C (2 Transistor-2 Capacitor) structure as one of representative cell structures of the ferroelectric semiconductor memory unit. In the 2T2C structure, "0"/"1" data is held by the difference in polarization amount between two capacitors. FIG. 24 is a wavelength chart showing this operation. After a word line WL is selected, the potential of a plate line PL rises to increase those of a pair of bit lines BL0 and BL1. Depending on data held by the cell, the potential of one of the bit lines BL0 and BL1 becomes high, and that of the other bit line becomes low. This potential difference is amplified by a sense amplifier SA to read out data.

FIG. 25 shows a 1T1C (1 Transistor-1 Capacitor) structure as another representative structure. FIG. 26 is a waveform chart showing the operation. In read, only one cell is selected, and a bit line (BL1 in FIG. 26) on the opposite side is set to a reference potential by a reference potential generation circuit. Similar to 2T2C, the potential difference between a pair of bit lines is amplified by the sense amplifier SA to read out data.

The 1T1C structure can implement a higher-density memory than that by the 2T2C structure, but the 2T2C structure is superior in data holding reliability. This is because, when the polarization amount decreases with the lapse of time, the potential is compared with a fixed reference potential in the 1T1C structure and a malfunction may occur. To the contrary, in the 2T2C structure, pieces of opposite information are written in a pair of cells, and even if the polarization amount decreases, the difference between the cells is hardly reversed.

As described at the start of the description of embodiments, a method of analyzing current consumption in an IC card and estimating recorded information exists. The 1T1C structure changes in current consumption depending on information, and is weak from this viewpoint. However, the 2T2C structure is a symmetrical structure, keeps current consumption constant, and is strong.

The 1T1C structure is apparently superior in consideration of the memory capacity, but the 2T2C structure should be selected in terms of the reliability and security.

Several embodiments of the present invention will be described below with reference to several views of the accompanying drawing. In the following description, the same reference numerals denote the same parts throughout the drawing.

First Embodiment

FIG. 1 is a block diagram showing an arrangement example of a semiconductor integrated circuit device according to the first embodiment of the present invention.

As shown in FIG. 1, according to the first embodiment, a plurality of memory cell arrays (MEMORY ARRAY0 to MEMORY ARRAY3) in a memory unit are selectively used as a cell array which performs 1T1C operation and a cell array which performs 2T2C operation. Selective use information of 1T1C/2T2C is recorded in a PROM, e.g., a fuse 1. The fuse 1 is formed in, e.g., a semiconductor chip 2 in which an array is formed. An input address (address) input to the chip 2 is compared with information recorded in the fuse 1 to determine whether the input address hits a cell array of 1T1C operation or a cell array of 2T2C operation. FIG. 2 shows a circuit example of a 1T1C/2T2C control 3 which performs this determination.

As shown in FIG. 2, in this circuit example, information on whether the cell is a BL0 or BL1 cell in 1T1C operation is assigned to the most significant bit of an address. An array which performs 1T1C operation and an array which performs 2T2C operation are divided using bit A (MSB-1) next to the most significant bit and bit A (MSB-2) next to MSB-1. Pieces of information {in(0), in(1), in(2), in(3)} are pieces of information recorded in the fuse 1, and are pieces of operation mode information. The operation mode information in this example is address information of an array which performs 2T2C operation or address information of an array which performs 1T1C operation. The 1T1C/2T2C control 3 in this example generates operation information, e.g., a control signal EN1T1C on the basis of the input address and operation mode information. Internal operation in this example is 1T1C operation for a "1"-level control signal EN1T1C and 2T2C operation for a "0"-level control signal EN1T1C. FIG. 3 shows a memory map for pieces of information {in(0), in(1), in(2), in(3)}={0, 1, 1, 1}.

As shown in FIG. 3, the memory space is divided into eight areas. An area starting from b0000 . . . and an area starting from b1000 . . . perform 2T2C operation, and the remaining areas perform 1T1C operation. The area starting from b1000 . . . and the area starting from b1000 . . . physically correspond to the same memory array.

The 1T1C/2T2C control 3 supplies the signal EN1T1C to a peripheral circuit 4 which controls a cell array. The control signal EN1T1C is operation information, and the peripheral circuit 4 accesses a cell array in the 2T2C mode or 1T1C mode on the basis of the operation information.

According to the first embodiment, 1T1C operation and 2T2C operation can be selectively used in one memory unit. By using this memory unit, the 2T2C operation area serves as a nonvolatile memory area, and the 1T1C operation area serves as a volatile memory (corresponding to a conventional cache memory; in practice, corresponding to a nonvolatile cache memory in this example). The nonvolatile memory area can maintain high information confidentiality, whereas a largest possible volatile memory area can efficiently ensure the memory capacity.

As a method of selectively using the 2T2C and 1T1C operation areas, several methods are conceivable in addition to the above-mentioned method of selectively using the 2T2C and 1T1C operation areas as a nonvolatile memory area and a volatile memory area (corresponding to a cache memory). These methods will be explained.

Selective Use by Software Operation Mode

A user mode area which is restricted by operation by an OS (Operating System) is assigned to the 1T1C operation area, and an unrestricted kernel mode area is assigned to the 2T2C operation area. For example, the data holding reliability can be improved, and high security can be secured for information stored in the 2T2C operation area.

The reliability in the 1T1C operation area, e.g., the data holding reliability and information confidentiality can be improved by protection by an OS management mechanism.

(Selective Use by Information Confidentiality)

Information which must ensure high security, e.g., a cryptographic program or data, personal information, ID, or digital certificate information is assigned to the 2T2C operation area, and the remaining information is assigned to the 1T1C operation area.

The method of selectively using the 2T2C and 1T1C operation areas is not limited to the above ones, and these methods can be variously combined. The user can arbitrarily adopt a desired method.

To realize selective use, two types of memory units may be simply mounted in a system. However, for a small-scale system, embedding a memory in one chip relatively enlarges the peripheral memory control circuit. Thus, selective use by one type of memory unit is advantageous to the downsizing and cost of an electronic device.

Second Embodiment

FIG. 4 is a block diagram showing an arrangement example of a semiconductor integrated circuit device according to the second embodiment of the present invention.

As shown in FIG. 4, according to the second embodiment, a general memory element, e.g., a nonvolatile semiconductor memory element (memory) 1' is employed instead of an area setting fuse circuit, and a signal (control PROM) for controlling the memory element 1' is supplied. The signal (control PROM) is, e.g., a signal for controlling an operation mode information program, or operation mode information itself.

According to the second embodiment, settings can be changed by only changing software because the fuse 1 is not used as a PROM, unlike the first embodiment.

If the nonvolatile semiconductor memory element is used as an area setting PROM, area setting need not be controlled during normal operation of the system. This facilitates replacement of an existing system.

Third Embodiment

FIG. 5 is a block diagram showing an arrangement example of a semiconductor integrated circuit device according to the third embodiment of the present invention.

As shown in FIG. 5, the third embodiment does not use any area setting PROM, unlike the first and second embodiments. Setting of the 1T1C and 2T2C operation areas can be changed by only changing software.

The third embodiment does not use any signal (Control PROM), unlike the second embodiment. No additional control terminal need be arranged, thus replacement of an existing system is facilitated.

Figure 6:
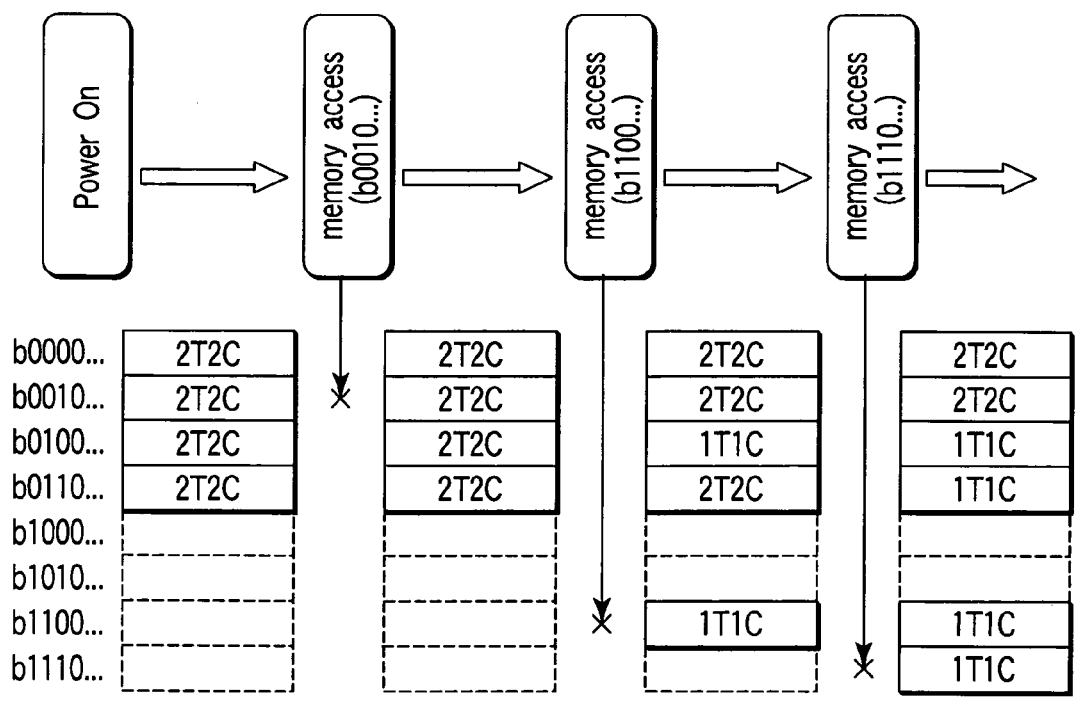
FIG. 6 is a view showing an operation example of the semiconductor integrated circuit device according to the third embodiment.

FIG. 6 shows an operation example of the semiconductor integrated circuit device according to the third embodiment.

As shown in FIG. 6, similar to the first embodiment, the most significant bit A (MSB) of an address is assigned to information on whether the cell of a BL0 or BL1 cell in 1T1C operation. The memory area is divided using bit A (MSB-1) next to the most significant bit and bit A (MSB-2) next to MSB-1.

In the memory unit according to the third embodiment, the entire area serves as a 2T2C operation area immediately after power-on. In access to the 2T2C operation area, i.e., an area starting from b0 (b0010 in FIG. 6), the target area is accessed in the 2T2C mode. In access to the 1T1C area, e.g., access to an area starting from b1 (b1100 in FIG. 6), two target areas are changed to the 1T1C operation area and then accessed in the 1T1C mode (the two target areas are b1100 and b0100 in this example).

Figure 7:
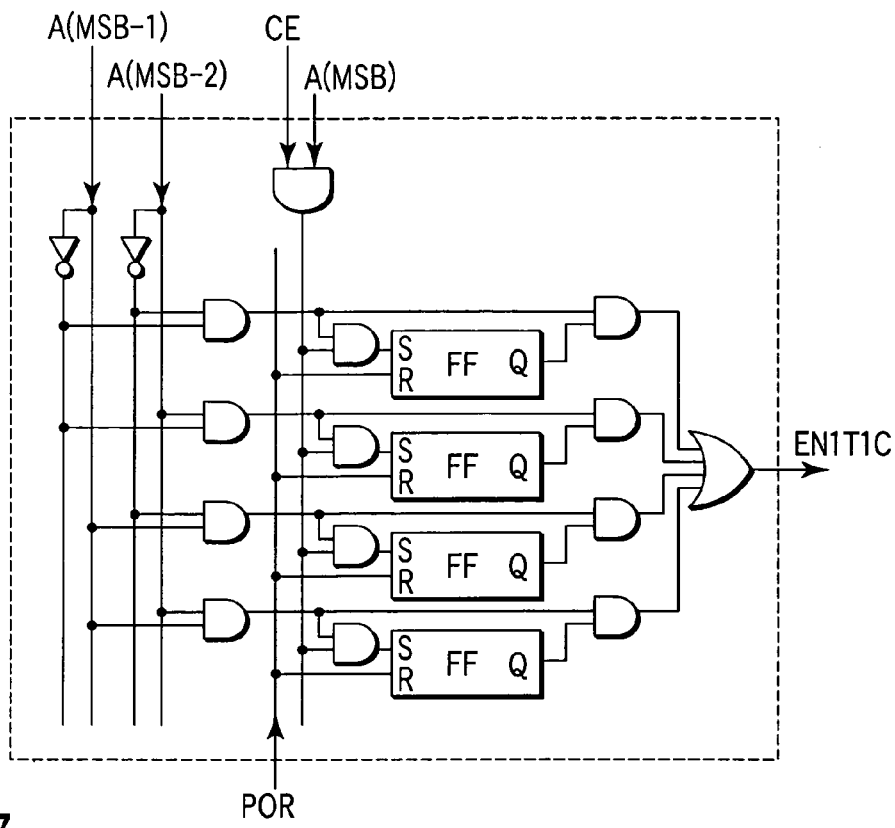
FIG. 7 is a circuit diagram showing a circuit example of a 1T1C/2T2C control.

Different memory area settings can be obtained using the same memory unit as far as an area to be accessed is fixed by software from power-on to the end of operation. FIG. 7 shows an example of a 1T1C/2T2C control 3' which realizes this operation example.

As shown in FIG. 7, in the 1T1C/2T2C control 3' according to this example, a signal POR changes to "HIGH" during reset upon power-on, and four SR flip-flops (SR-FFs) are reset (Q=LOW). One SR-FF corresponding to access to the 1T1C area (A(MSB)=HIGH) is set (Q=HIGH). The 1T1C or 2T2C mode is determined on the basis of an output Q from the SR-FF and address signals A(MSB-1) and A(MSB-2).

Fourth Embodiment

The fourth embodiment is related to a circuit arrangement example of a memory array. The fourth embodiment will exemplify a ferroelectric semiconductor memory cell as an example of a memory cell, but the memory cell is not limited to this.

Figure 8:
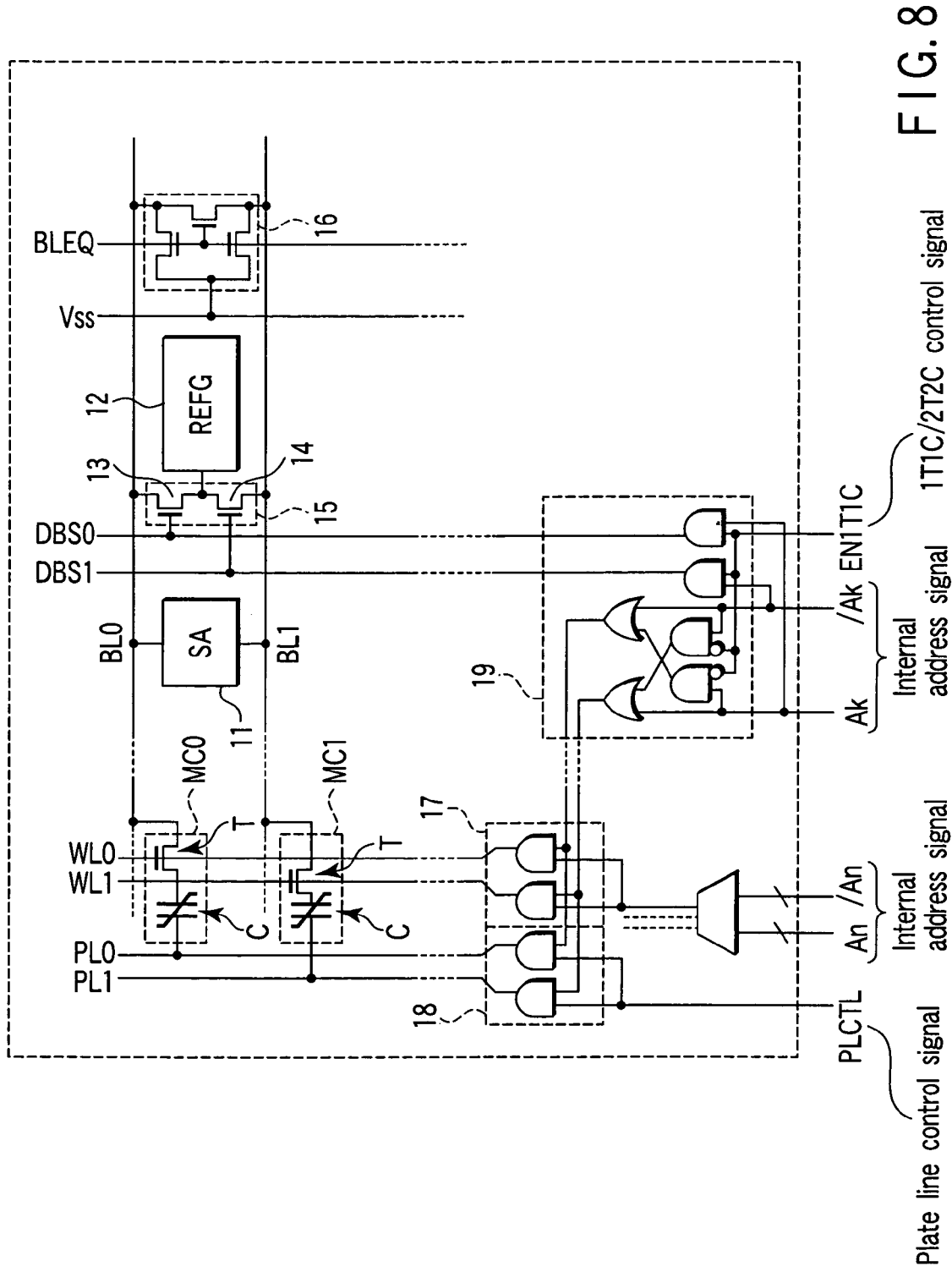
FIG. 8 is a block diagram showing an arrangement example of a semiconductor integrated circuit device according to the fourth embodiment of the present invention.

FIG. 8 is a block diagram showing an arrangement example of a semiconductor integrated circuit device according to the fourth embodiment of the present invention.

As shown in FIG. 8, each of memory cells MC0 and MC1 includes a cell transistor (T) and ferroelectric capacitor (C). One end of the current path of the cell transistor (T) of the memory cell MC0 is connected to one terminal of the capacitor (C), the other end of the current path is connected to a bit line BL0, and the gate of the cell transistor (T) is connected to a word line WL0. Similarly, one end of the current path of the cell transistor (T) of the memory cell MC1 is connected to one terminal of the capacitor (C), the other end of the current path is connected to a bit line BL1, and the gate of the cell transistor (T) is connected to a word line WL1.

The bit lines BL0 and BL1 are connected to an amplifier circuit, e.g., a sense amplifier (SA) 11. The sense amplifier 11 amplifies the potential difference between the potentials of the bit lines BL0 and BL1. A reference potential generation circuit (REFG) 12 generates a reference potential VREF. The reference potential VREF is used to amplify the potential difference by the sense amplifier 11, and serves as a reference for determining whether read data is "0" or "1". The output of the reference potential generation circuit 12 is connected to the bit line BL0 via a transistor 13 and the bit line BL1 via a transistor 14. The transistors 13 and 14 constitute a reference potential supply circuit 15. The reference potential supply circuit 15 in this example can selectively supply the reference potential VREF to either the bit line BL0 or BL1, and stop supply of the reference potential. A bit line equalization circuit 16 equalizes the potentials of bit lines BL0 and BL1 to an intra-circuit ground potential Vss. In this example, the potentials of the bit lines BL0 and BL1 are equalized to the potential Vss in accordance with a bit line equalization signal BLEQ before, e.g., data read.

The word lines WL0 and WL1 are connected to a word line driving circuit 17. The word line driving circuit 17 in this example can select and drive one or both of the word lines WL0 and WL1.

This example is an example of a ferroelectric semiconductor memory, and thus the memory has plate lines PL0 and PL1. The other terminal of the capacitor (C) of the memory cell MC0 is connected to the plate line PL0, and the other terminal of the capacitor (C) of the memory cell MC1 is connected to the plate line PL1. The plate lines PL0 and PL1 are connected to a plate line driving circuit 18. The plate line driving circuit 18 in this example can select and drive one or both of the plate lines PL0 and PL1.

The reference potential supply circuit 15, word line driving circuit 17, and plate line driving circuit 18 are controlled by an operation mode control circuit 19. The operation mode control circuit 19 receives operation information, e.g., the above-mentioned control signal EN1T1C. The control signal EN1T1C in this example enables 1T1C operation at "HIGH" and 2T2C operation at "LOW".

(1T1C Operation)

When 1T1C operation is enabled, the operation mode control circuit 19 controls the reference potential supply circuit 15, word line driving circuit 17, and plate line driving circuit 18 in accordance with the logics of internal address signals Ak and /Ak. The reference potential supply circuit 15 connects the output of the reference potential generation circuit 12 to either the bit line BL0 or BL1 in accordance with the logics of the internal address signals Ak and /Ak. Similarly, the word line driving circuit 17 drives either the word line WL0 or WL1 in accordance with the logics of internal address signals An and /An. Similarly, the plate line driving circuit 18 drives either the plate line PL0 or PL1 in accordance with the logics of the internal address signals Ak and /Ak. A selected one of the plate lines PL0 and PL1 receives a plate line control signal PLCTL.

The internal address signals Ak and /Ak are logic signals for selecting the bit line BL0 or BL1, and either of the signals changes to "HIGH" only in memory access. For example, (Ak, /Ak)=(LOW, LOW) in no access, and (Ak, /Ak)=(HIGH, LOW) or (LOW, HIGH) in access. The internal address signals An and /An are logic signals for selecting a word line.

(2T2C Operation)

When 2T2C operation is enabled, the operation mode control circuit 19 inactivates the internal address signals Ak and /Ak. The reference potential supply circuit 15 then disconnects the output of the reference potential generation circuit 12 from both the bit lines BL0 and BL1. The word line driving circuit 17 drives, e.g., simultaneously drives both the word lines WL0 and WL1. Similarly, the plate line driving circuit 18 drives, e.g., simultaneously drives both the plate lines PL0 and PL1.

In this manner, the fourth embodiment can provide a circuit arrangement of the memory array capable of coping with switching between 1T1C operation and 2T2C operation.

Fifth Embodiment

The fifth embodiment is related to a circuit arrangement example of a memory array, similar to the fourth embodiment. The fifth embodiment will describe a ferroelectric semiconductor memory cell as an example of a memory cell, but the memory cell is not limited to this.

Figure 9:
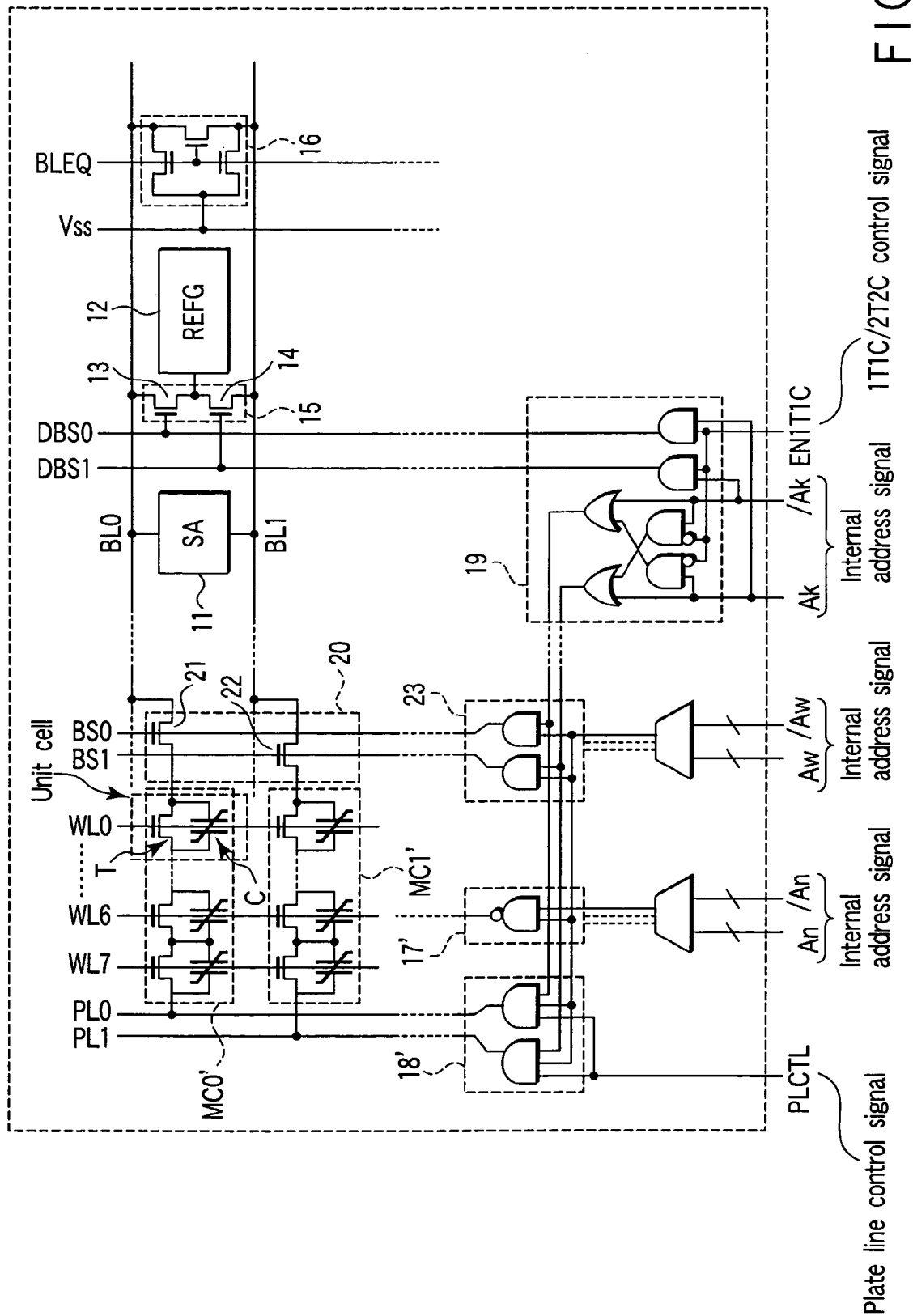
FIG. 9 is a block diagram showing an arrangement example of a semiconductor integrated circuit device according to the fifth embodiment of the present invention.

FIG. 9 is a block diagram showing an arrangement example of a semiconductor integrated circuit device according to the fifth embodiment of the present invention.

As shown in FIG. 9, the fifth embodiment is different from the fourth embodiment in the memory cell. Each of memory cells MC0' and MC1' according to the fifth embodiment is a memory which includes of series connected memory cells each having a transistor having a source terminal and a drain terminal and a ferroelectric capacitor inbetween the two terminals, hereafter named "Series connected TC unit type ferroelectric RAM". One end of the current path of the memory cell MC0' is connected to a bit line BL0 via a block selection transistor 21 of a block selector 20, and its other end is connected to a plate line PL0. Similarly, one end of the current path of the memory cell MC1' is connected to a bit line BL1 via a block selection transistor 22 of the block selector 20, and its other end is connected to a plate line PL1. The gate of the block selection transistor 21 is connected to a block selection line BS0, and the gate of the block selection transistor 22 is connected to a block selection line BS1.

The block selection lines BS0 and BS1 are connected to a block selection line driving circuit 23. The block selection line driving circuit 23 in this example can select and drive one or both of the block selection lines BS0 and BS1.

Unlike the fourth embodiment, a word line driving circuit 17' selects and drives only one word line. The word line driving circuit 17' in this example selects and drives one of the word lines WL0, WL1, . . . on the basis of internal address signals An and /An.

Similar to the fourth embodiment, a plate line driving circuit 18' can select and drive one or both of the plate lines PL0 and PL1. In the fourth embodiment, in selecting and driving the plate lines PL0 and PL1, the plate line driving circuit 18 executes selection on the basis of logic signals, i.e., internal address signals Ak and /Ak for selecting the bit line BL0 or BL1. In this example, the plate line driving circuit 18' executes selection on the basis of logic signals, i.e., internal address signals Aw and /Aw for selecting the block selection line BS0 or BS1.

(1T1C Operation)

When 1T1C operation is enabled, an operation mode control circuit 19 controls the reference potential supply circuit 15 and plate line driving circuit 18' in accordance with the logics of the internal address signals Ak and /Ak, similar to the fourth embodiment. Further in the fifth embodiment, the operation mode control circuit 19 controls the block selection line driving circuit 23 in accordance with the logics of the internal address signals Ak and /Ak. The reference potential supply circuit 15 connects the output of the reference potential generation circuit 12 to either the bit line BL0 or BL1 in accordance with the logics of the internal address signals Ak and /Ak. The block selection line driving circuit 23 drives either the block selection line BS0 or BS1 in accordance with the logics of the internal address signals Aw and /Aw. Similarly, the plate line driving circuit 18' drives either the plate line PL0 or PL1 in accordance with the logics of the internal address signals Aw and /Aw.

(2T2C Operation)

When 2T2C operation is enabled, the operation mode control circuit 19 inactivates the internal address signals Ak and /Ak. The reference potential supply circuit 15 then disconnects the output of the reference potential generation circuit 12 from both the bit lines BL0 and BL1. The block selection line driving circuit 23 drives, e.g., simultaneously drives both the block selection lines BS0 and BS1. Similarly, the plate line driving circuit 18' drives, e.g., simultaneously drives both the plate lines PL0 and PL1.

The fifth embodiment can provide another circuit arrangement of the memory array capable of coping with switching between 1T1C operation and 2T2C operation.

In the ferroelectric memory according to the fifth embodiment and the ferroelectric memory according to the fourth embodiment, the plate line PL is driven in accessing a memory cell. However, in some methods, the plate line PL is not driven. For example, the potential of the plate line PL is, e.g., fixed to the middle potential of a sense amplifier power supply voltage. When this method is adopted, the current circuit requires a double voltage for each of read and write, but operates normally.

At present, an improvement in particularly ferroelectric material is advanced, and the ferroelectric characteristic has been improved. If the ferroelectric characteristic is improved to enable read and write at low voltage, the voltage necessary for read and write even in the method of not driving the plate line PL is expected to be reduced to the voltage level in the method of driving the plate line PL.

Under this circumstance, the ferroelectric memory can select the method of driving the plate line PL and the method of not driving the plate line PL in accessing a memory cell.

Sixth Embodiment

The semiconductor integrated circuit device according to the first to fifth embodiments can switch between 1T1C operation and 2T2C operation. For example, a memory which stores information can be changed depending on the information in accordance with user's preferences, the security can be enhanced, or the memory capacity can be variably adjusted. Several applications of the semiconductor integrated circuit device will be explained as the sixth embodiment.

(Application 1)

Figure 10:
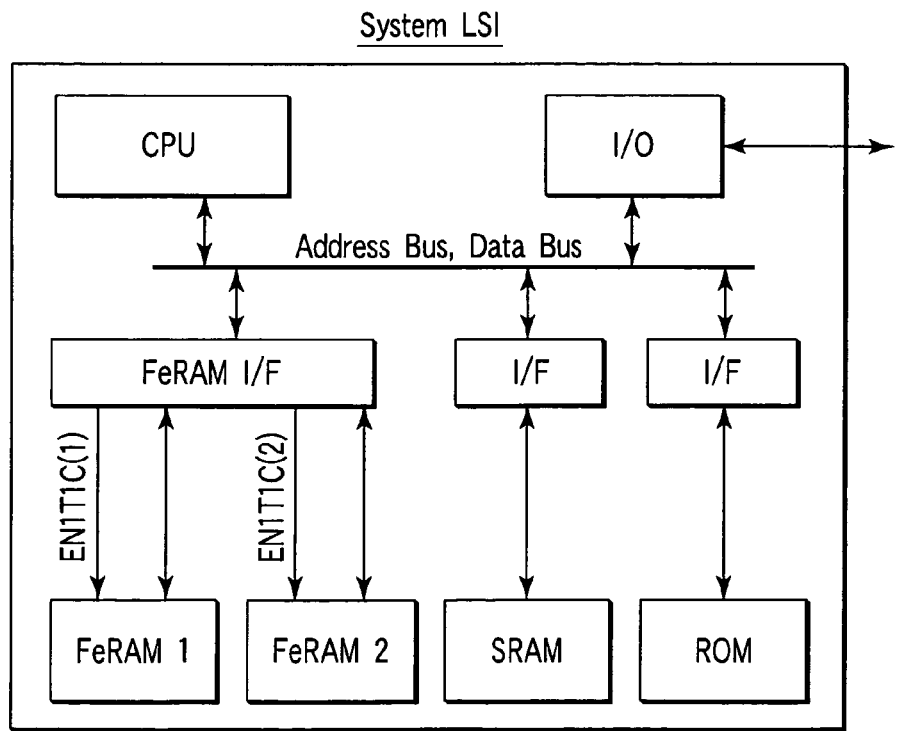
FIG. 10 is a block diagram showing an arrangement example of a system LSI according to application 1.

FIG. 10 is a block diagram showing an arrangement example of a system LSI according to application 1.

As shown in FIG. 10, for example, a CPU, I/O (input/output circuit), FeRAM I/F (ferroelectric semiconductor memory interface circuit), FeRAM 1, FeRAM 2, I/F (interface circuit), SRAM, and ROM are integrated as IP macros (functional blocks) in a system LSI chip 100.

For example, the FeRAM I/F outputs operation information EN1T1C as described in the above embodiments to the FeRAM 1 and FeRAM 2. Upon reception of the operation information EN1T1C, each of the FeRAM 1 and FeRAM 2 can switch between 1T1C operation and 2T2C operation, and variously adjust the size of an area in which 1T1C operation is done and that of an area in which 2T2C operation is done.

In accordance with information to be stored, the system LSI according to application 1 can store the information in the area in which 1T1C operation is done or the area in which 2T2C operation is done. For example, information which requires high data holding reliability and information which ensures high security are stored in the area in which 2T2C operation is done.

The area in which 1T1C operation is done can be widened, or the entire area can be subjected to 1T1C operation. In this case, the memory capacity can be increased. Also, the entire area can be subjected to 2T2C operation. In this case, the memory capacity decreases, but the data holding reliability and security reliability can be improved.

Such system LSI can be adopted in portable electronic device ICs which require downsizing of the device and improvement of the reliability, e.g., a cell phone IC, PDA IC, and portable image device IC (digital still camera IC and digital movie camera IC). However, applications of the system LSI are not limited to them.

(Application 2)

Figure 11:
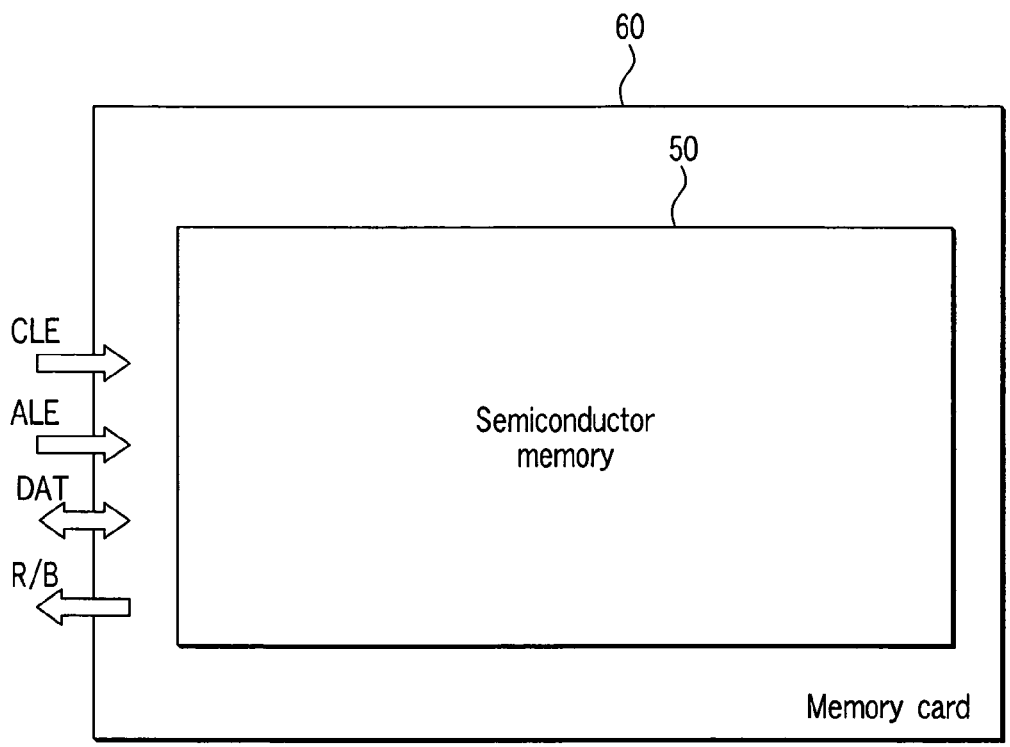
FIG. 11 is a block diagram showing the first example of a memory card according to application 2.

FIG. 11 is a block diagram showing the first example of a memory card according to application 2.

As shown in FIG. 11, a memory card 60 includes a semiconductor memory 50 according to the above embodiments, e.g., a ferroelectric semiconductor memory as a semiconductor memory device. The memory card 60 operates by exchanging a predetermined signal and data with an electronic device (not shown).

A signal line (DAT), command line enable signal line (CLE), address line enable line (ALE), and ready/busy signal line (R/B) are connected to the memory card 60. The signal line (DAT) transfers data, an address, or a command signal. The command line enable signal line (CLE) transfers a signal representing that a command signal has been transferred to the signal line (DAT). The address line enable signal line transfers a signal representing that an address signal has been transferred to the signal line (DAT). The ready/busy signal line (R/B) transfers a signal representing whether the semiconductor memory 50 is ready or busy.

Figure 12:
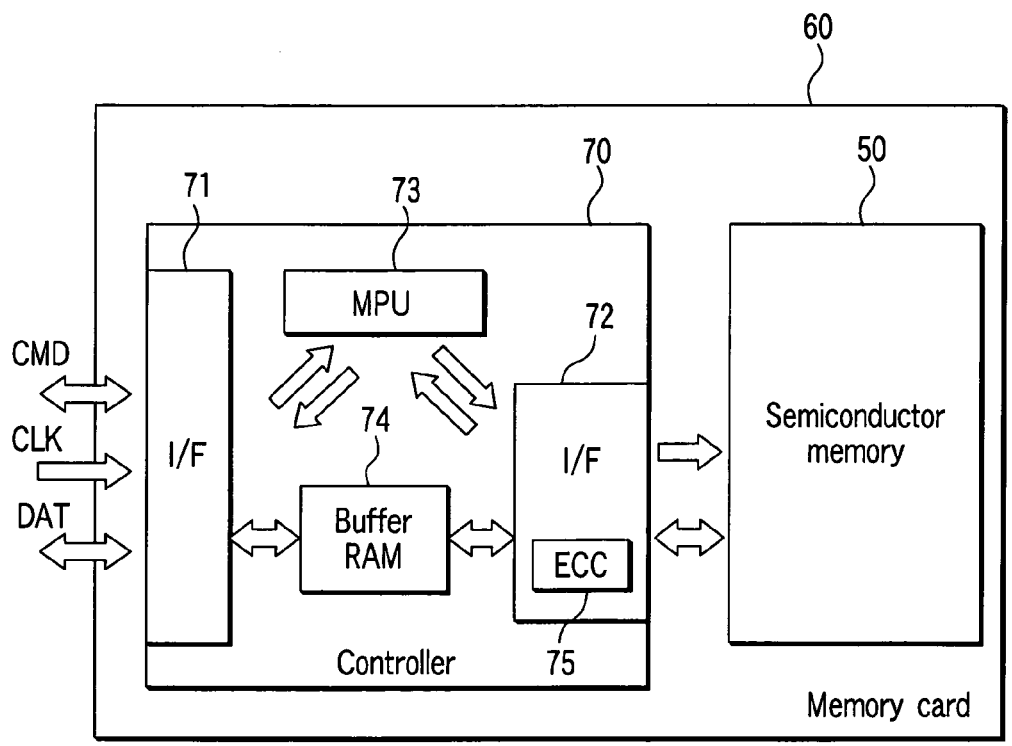
FIG. 12 is a block diagram showing the second example of the memory card according to application 2.

FIG. 12 is a block diagram showing the second example of the memory card according to application 2.

As shown in FIG. 12, the memory card 60 according to the second example includes the semiconductor memory 50 and a controller 70 which controls the semiconductor memory 50, unlike the memory card according to the first example. The controller 70 exchanges a signal with an external electronic device (not shown).

The controller 70 includes interface units (I/Fs) 71 and 72, a microprocessor unit (MPU) 73, a buffer RAM 74, and an error correction code unit (ECC) 75. The interface unit 71 exchanges a signal with an external electronic device (not shown). The interface unit 72 exchanges a signal with the semiconductor memory 50. The microprocessor unit 73 converts a logical address into a physical address. The buffer RAM 74 temporarily stores data. The error correction code unit 75 generates an error correction code. The command signal line (CMD), clock signal line (CLK), and signal line (DAT) are connected to the memory card 60. The number of control signal lines, the bit width of the signal line (DAT), and the circuit arrangement of the controller 70 can be properly changed.

Figure 13:
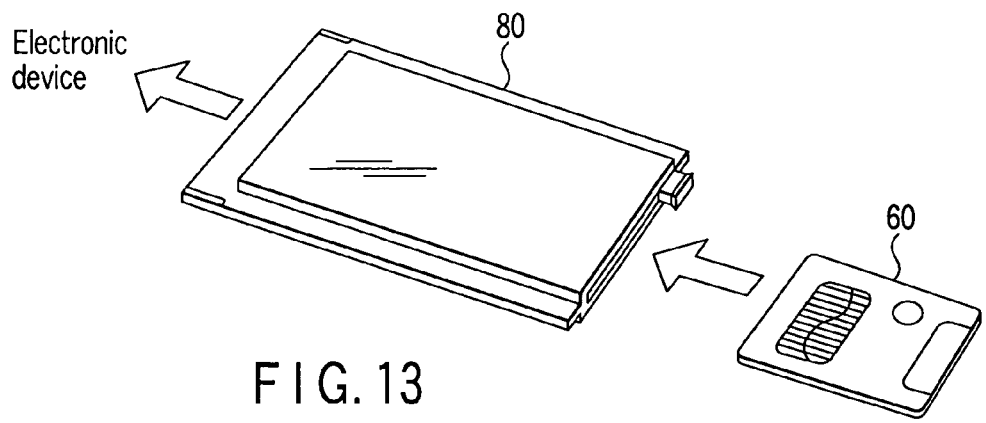
FIG. 13 is a perspective view showing an example of a memory card folder.

FIG. 13 is a perspective view showing an example of a memory card folder in which the memory card 60 according to the first and second examples is mounted.

As shown in FIG. 13, the memory card 60 according to the first and second examples is mounted in a memory card folder 80. The memory card folder 80 is connected to an electronic device (not shown), and functions as an interface between the memory card 60 and the electronic device. The memory card folder 80 can execute one or more functions of the controller 70 shown in FIG. 12.

Figure 14:
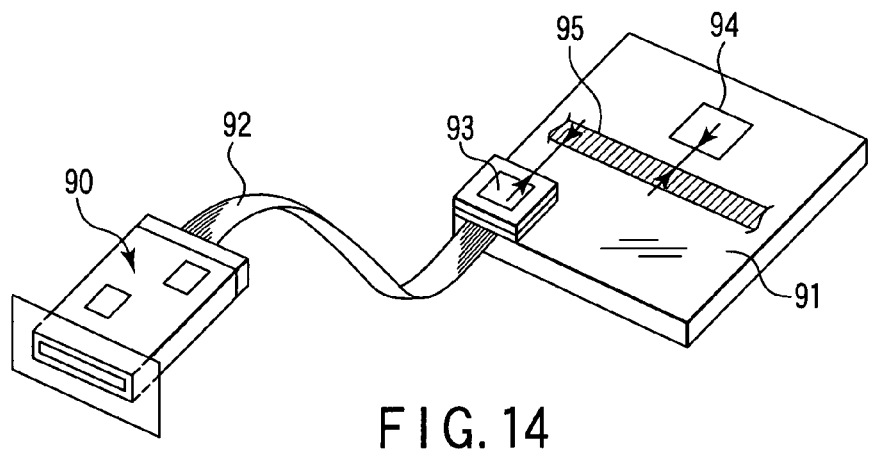
FIG. 14 is a perspective view showing an example of a connection device.

FIG. 14 is a perspective view showing an example of a connection device capable of mounting both the memory card 60 according to the first and second examples and the memory card folder 80.

As shown in FIG. 14, the memory card 60 and memory card folder 80 are mounted in a connection device 90, and electrically connected to the electronic device mounted on a board 91. The connection device 90 is connected to the board 91 via a connection wire 92 and interface circuit 93, and to a CPU (Central Processing Unit) 94 and the like via a bus 95.

Figure 15:
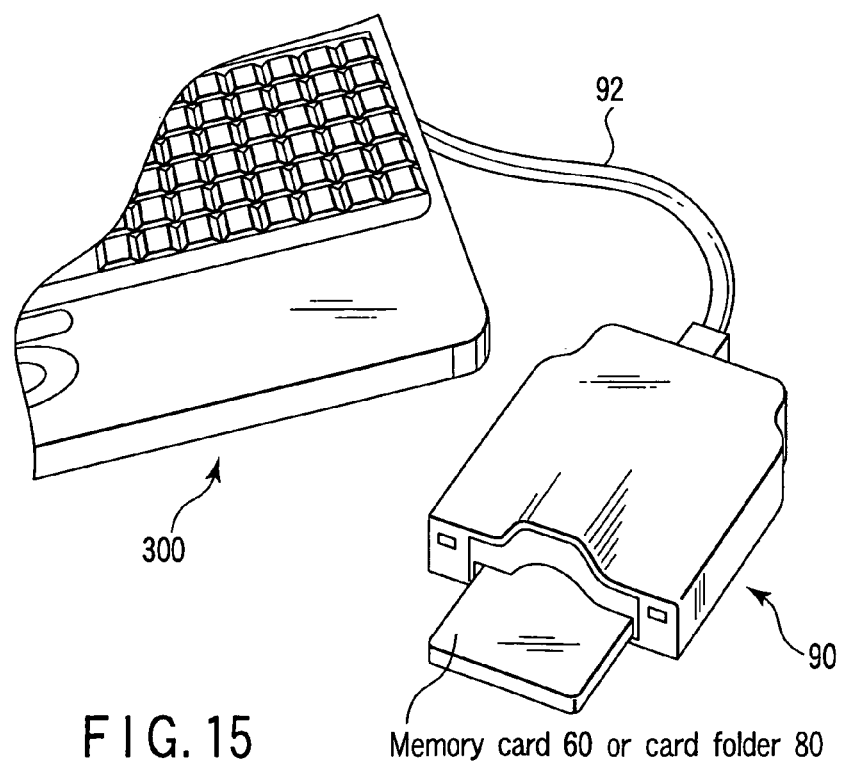
FIG. 15 is a perspective view showing an application of the connection device.

FIG. 15 is a perspective view showing an application of.the connection device.

As shown in FIG. 15, the memory card 60 or memory card folder 80 is mounted in the connection device 90, and connected to a PC (Personal Computer) 300 via the wire 92.

(Application 3)

FIG. 16 is a view showing the outer appearance of an example of an IC card according to application 3. FIG. 17 is a block diagram showing an arrangement example of the IC card.

As shown in FIGS. 16 and 17, an IC card 500 includes the semiconductor memory 50 serving as a memory unit, a ROM (Read Only Memory) 410, a RAM (Random Access Memory) 420, and a CPU (Central Processing Unit) 430. The IC card 500 is connected to an electronic device via a plane terminal 600. The CPU 430 includes an arithmetic unit 431 and control unit 432. The control unit 432 is connected to the semiconductor memory 50, ROM 410, and RAM 420, and controls these memories. The arithmetic unit 431 is a logic unit, and executes various arithmetic processes in accordance with a command from the control unit 432.

In this example, the semiconductor memory described in the above embodiments can be applied to the semiconductor memory 50, ROM 410, and RAM 420.

(Application 4)

As described in applications 2 and 3, the semiconductor memory according to the first to fifth embodiments can be applied to a memory card and IC card. Application 4 is an application of a memory card or IC card having the semiconductor memory according to the first to fifth embodiments. The memory card or IC card can be utilized as a removable medium in the system. For example, the memory card or IC card is a removable medium in, e.g., an electronic voting system or POS (Point Of Sales) system. These systems have very high information confidentiality, and information communication using a network may cause a security problem. In this case, the memory card 60 or IC card 500 having the semiconductor memory described in the first to fifth embodiments is preferably used as an information transmission medium. The memory card 60 and IC card 500 store not only information, but also allow setting, e.g., an encryption key by using an IC function. Setting of the encryption key can suppress accidental access to the memory card 60 or IC card 500, and suppress accidental copying/tampering/browsing/ leakage of information. The semiconductor memory described in the first to fifth embodiments can improve both software security and hardware security. Hence, the semiconductor memory can be effectively applied to a system which requires high information confidentiality.

Figure 18:
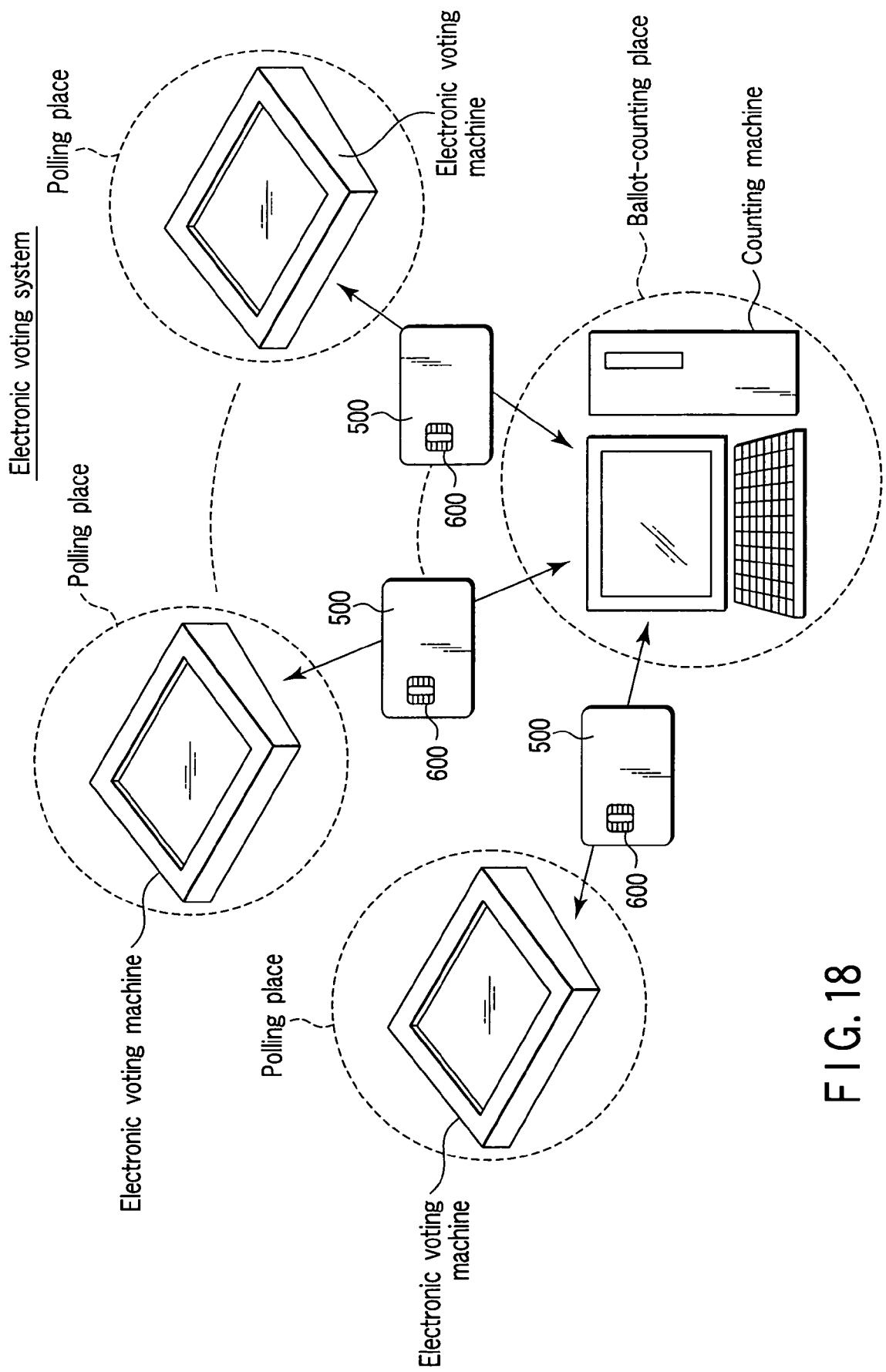
FIG. 18 is a view showing an example of an electronic voting system according to application 4.

FIG. 18 is a view showing an example of an electronic voting system according to application 4.

As shown in FIG. 18, an electronic voting machine is installed in a polling place, and each voter gives his/her vote to a candidate by using the electronic voting machine. Voting results are stored in, e.g., the IC card 500, and the IC card 500 is carried to a ballot-counting place. A counting machine is installed in the ballot-counting place, and the voting results stored in the IC card 500 are counted.

(Application 5)

Figure 19:
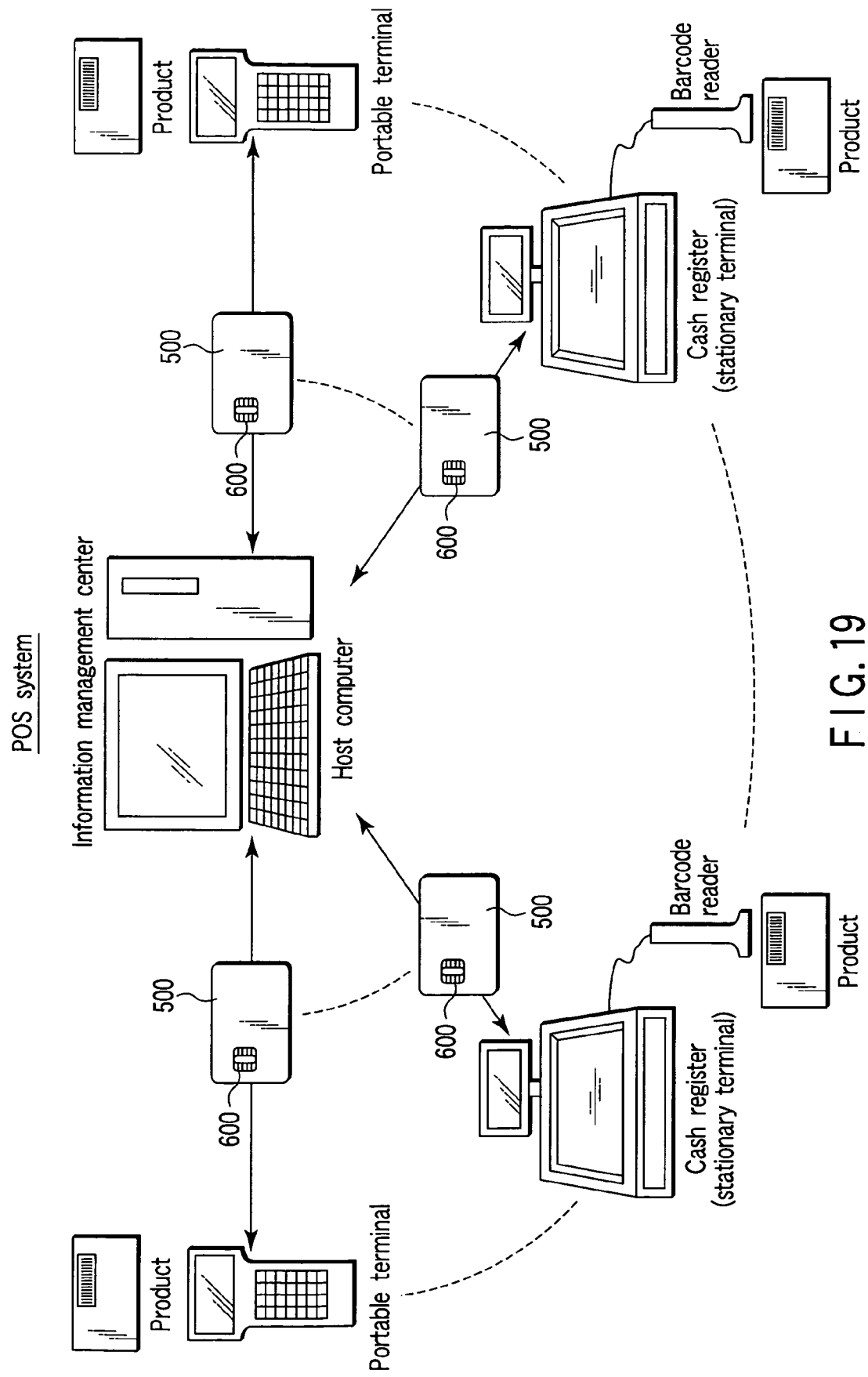
FIG. 19 is a view showing an example of a POS system according to application 5.

FIG. 19 is a view showing an example of a POS system according to application 5.

As shown in FIG. 19, a permanent storefront such as a shop is equipped with a stationary terminal such as a POS cash register, and a host computer is installed in an information management center. Sales information, customer information, and the like input to the cash register are stored in the IC card 500, carried to the information management center, and input to the host computer. A POS portable terminal is prepared at a moving storefront such as a collecting person. Package collection information, customer information, and the like input to the portable terminal are stored in the IC card 500, carried to the information management center, and input to the host computer. The sales information, package collection information, and customer information input to the host computer are analyzed and utilized as information sources for customer management, sales management, inventory management, purchase management, and the like.

FIG. 19 illustrates a POS system using both stationary and portable terminals, but the POS system may use only a stationary terminal or only a portable terminal. Which of the terminals is to be used may be properly selected in consideration of the demand, industry type, or management scale of a company which uses a POS system.

FIG. 19 shows an example of the POS system, but the IC card 500 can be used not only in the sales field but also in inventory management, settlement management, and the like in the physical distribution field. The IC card 500 can also be utilized in a system other than the above one.

(Application 6)

Noncontact cards as memory cards and IC cards, which were normally contact cards, have recently been developed, and are beginning to be actually used. The noncontact card cannot directly externally exchange a signal, and has a higher-security structure than that of the contact card. However, the technology is advancing day by day, and someday even a noncontact card may not become safe. Under this circumstance, the noncontact memory card or IC card can employ the semiconductor memory according to the first to fifth embodiments.

A typical example of the noncontact memory card and IC card is an IC tag. Application 6 concerns an IC tag using the semiconductor memory according to the first to fifth embodiments and a system using the IC tag.

Figure 20:
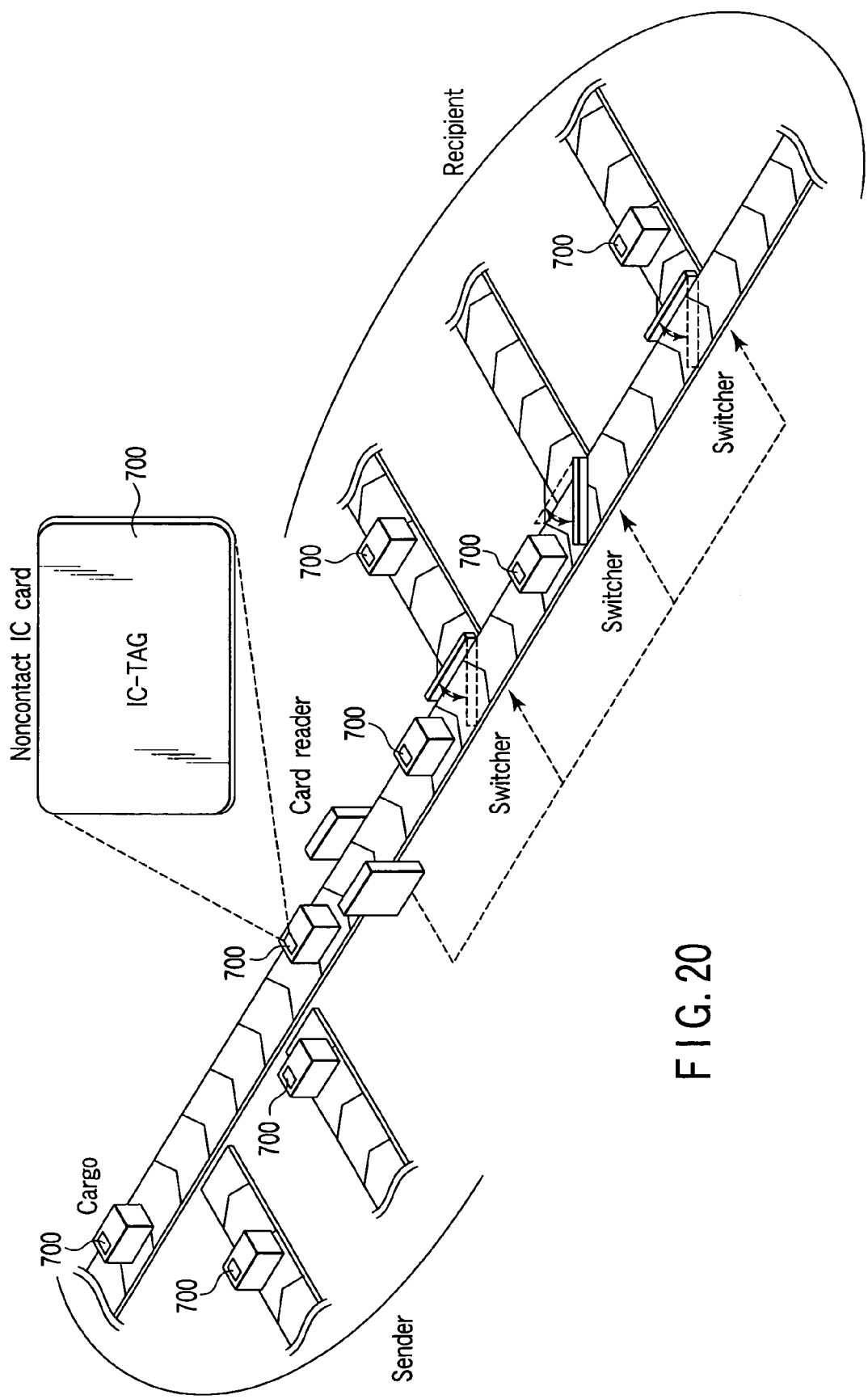
FIG. 20 is a view showing an example of a transfer system according to application 6.

FIG. 20 is a view showing an example of a transfer system according to application 6.

As shown in FIG. 20, an IC tag 700 is stuck to each package, or inserted into a tag folder tied to each package. After recipient information or the like is recorded on the IC tag 700 at the sender, the package is sent to the transfer system. The transfer system is equipped with a card reader, and the card reader reads the recipient information from the IC tag 700 when the package passes through the card reader. The switcher of the transfer system sorts the package by the recipient in accordance with the read information.

When the semiconductor memory according to the first to fifth embodiments is used for the IC tag 700, accidental copying/tampering/browsing/leakage of information recorded on the IC tag 700 can be suppressed. As a result, the security of the system using the IC tag 700 can be improved, and packages can be safely sent from the senders to the recipients. When personal information or the like is recorded on the IC tag 700, the confidentiality can be enhanced. The reliability of holding information recorded on the IC tag can also be improved.

Such transfer system can also be applied to a baggage claim system in an airport or the like, in addition to physical distribution.

(Application 7)

The IC tag is not only stuck to a package, but also used as a medium which records product information. Simply, the IC tag can replace a barcode. By replacing the barcode with the IC tag, even product information which cannot be recorded by a barcode can be recorded.

FIG. 21 is a view showing a POS system according to application 7.

As shown in FIG. 21, the IC tag 700 is stuck to a product. The IC tag 700 differs from a barcode in that information is rewritable. Thus, the IC tag 700 suffers a security problem such as accidental copying/tampering/browsing/leakage of recorded information. To prevent this, the IC tag 700 uses the semiconductor memory according to the first to fifth embodiments. This can improve the security of the IC tag 700 stuck to the product. For example, if tampering of IC tag information stuck to a product can be prevented, accidental tampering of the best-before date and accidental tampering of price indication can be prevented. Safe products can be provided to the consumer. The reliability of holding information recorded on the IC tag can also be improved.

This example has been described in accordance with the POS system shown in FIG. 19, but is not limited to this. In the POS system shown in FIG. 19, the IC card serving as an information medium may be replaced with the noncontact IC tag 700.

The first to sixth embodiments of the present invention can provide a semiconductor integrated circuit device capable of efficiently ensuring a largest possible memory capacity while maintaining high information confidentiality, and an information storage method for the semiconductor integrated circuit device.

The present invention has been described in accordance with the first to sixth embodiments. The present invention is not limited to these embodiments, and can be variously modified without departing from the spirit and scope of the invention in practicing the invention.

The above embodiments can be singly practiced or properly combined.

The above embodiments include inventions on various stages, and inventions on various stages can be extracted by an appropriate combination of building components disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a cell array having a plurality of memory cells;
a peripheral circuit which controls the cell array;
a state memory circuit which includes a state memory element that stores state information, the state memory element including a flip-flop circuit;
an operation information determination circuit which determines either of a first operation mode in which one bit is stored by using one memory cell and a second operation mode in which one bit is stored by using two semiconductor memory cells, and supplies operation information to the peripheral circuit, the operation information determining which of the first and second operation modes is used to operate the cell array, the operation information determination circuit generating the operation information on the basis of an input address and the state information stored in the state memory circuit; and
wherein the flip-flop circuit is reset upon power-on and changes in state on the basis of the input address.

2. A device according to claim 1, wherein when the flip-flop circuit changes in state on the basis of the input address, access to a memory area corresponding to the input address is fixed to the first or second operation mode.

3. A semiconductor integrated circuit device comprising:
a first memory cell which is connected to a first bit line and a first word line;
a second memory cell which is connected to a second bit line and a second word line;
an amplifier circuit which amplifies a potential difference between a potential of the first bit line and a potential of the second bit line;
a reference potential generation circuit which generates a reference potential;
a reference potential supply circuit which selects either of the first and second bit lines, supplies the reference potential to the selected bit line, and stops supply of the reference potential to the first and second bit lines; and
a word line driving circuit which selects and drives one or both of the first and second word lines.

4. A device according to claim 3, further comprising:
an operation mode switching circuit which receives operation information designating a first operation mode in which one bit is stored by using either of the first and second memory cells and a second operation mode in which one bit is stored by using both the first and second memory cells,
  wherein when the first operation mode is designated, the operation mode switching circuit causes the word line driving circuit to select and drive either of the first and second word lines, and the reference potential generation circuit to select either of the first and second bit lines and supply the reference potential to the selected bit line, and
  when the second operation mode is designated, the operation mode switching circuit causes the word line driving circuit to drive both the first and second word lines, and the reference potential generation circuit to stop supply of the reference potential to the first and second bit lines.

5. A device according to claim 4, wherein the first and second memory cells include ferroelectric memories.

6. A device according to claim 5, further comprising:
  a peripheral circuit which receives the operation information designating the first operation mode in which one bit is stored by using either of the first and second memory cells and the second operation mode in which one bit is stored by using both the first and second memory cells,
  wherein when the first operation mode is designated, the peripheral circuit causes the word line driving circuit to select and drive either of the first and second word lines, the reference potential generation circuit to select either of the first and second bit lines and supply the reference potential to the selected bit line, and the plate line driving circuit to select and drive either of the first and second plate lines, and
  when the second operation mode is designated, the peripheral circuit causes the word line driving circuit to drive both the first and second word lines, the reference potential generation circuit to stop supply of the reference potential to the first and second bit lines, and the plate line driving circuit to drive both the first and second plate lines.

7. A device according to claim 6, wherein the first and second memory cells include ferroelectric memories.

8. A device according to claim 3, further comprising:
  a first plate line which supplies a plate potential to the first memory cell;
  a second plate line which supplies the plate potential to the second memory cell; and
  a plate line driving circuit which selects and drive one or both of the first and second plate lines.

9. A device according to claim 8, wherein the first and second memory cells include ferroelectric memories.

10. A semiconductor integrated circuit device comprising:
  a first memory cell which is connected to a word line;
  a second memory cell which is connected to the word line;
  a first selection transistor which connects the first memory cell to a first bit line;
  a second selection transistor which connects the second memory cell to a second bit line;
  an amplifier circuit which amplifies a potential difference between a potential of the first bit line and a potential of the second bit line;
  a reference potential generation circuit which selects either of the first and second bit lines, supplies a reference potential to the selected bit line, and stops supply of the reference potential to the first and second bit lines; and
  a selection transistor driving circuit which selects and drives one or both of the first and second selection transistors.

11. A device according to claim 10, further comprising:
  a peripheral circuit which receives operation information designating a first operation mode in which one bit is stored by using either of the first and second memory cells and a second operation mode in which one bit is stored by using both the first and second memory cells,
  wherein when the first operation mode is designated, the peripheral circuit causes the selection transistor driving circuit to select and drive either of the first and second selection transistors, and the reference potential generation circuit to select either of the first and second bit lines and supply the reference potential to the selected bit line, and
  when the second operation mode is designated, the peripheral circuit causes the selection transistor driving circuit to drive both the first and second selection transistors, and the reference potential generation circuit to stop supply of the reference potential to the first and second bit lines.

12. A device according to claim 11, wherein the first and second memory cells include series connected TC unit type ferroelectric memories in each of which two terminals of a capacitor (C) are respectively connected to a source and drain of a cell transistor (T) to constitute a unit cell, and a plurality of unit cells are series-connected.

13. A device according to claim 10, further comprising:
  a first plate line which supplies a plate potential to the first memory cell;
  a second plate line which supplies the plate potential to the second memory cell; and
  a plate line driving circuit which selects and drives one or both of the first and second plate lines.

14. A device according to claim 13, wherein the first and second memory cells include series connected TC unit type ferroelectric memories in each of which two terminals of a capacitor (C) are respectively connected to a source and drain of a cell transistor (T) to constitute a unit cell, and a plurality of unit cells are series-connected.

15. A device according to claim 13, further comprising:
  a peripheral circuit which receives operation information designating a first operation mode in which one bit is stored by using either of the first and second memory cells and a second operation mode in which one bit is stored by using both the first and second memory cells,
  wherein when the first operation mode is designated, the peripheral circuit causes the selection transistor driving circuit to select and drive either of the first and second selection transistors, the reference potential generation circuit to select either of the first and second bit lines and supply the reference potential to the selected bit line, and the plate line driving circuit to select and drive either of the first and second plate lines, and
  when the second operation mode is designated, the peripheral circuit causes the selection transistor driving circuit to drive both the first and second selection transistors, the reference potential generation circuit to stop supply of the reference potential to the first and second bit lines, and the plate line driving circuit to drive both the first and second plate lines.

16. A device according to claim 15, wherein the first and second memory cells include series connected TC unit type ferroelectric memories in each of which two terminals of a capacitor (C) are respectively connected to a source and drain of a cell transistor (T) to constitute a unit cell, and a plurality of unit cells are series-connected.

* * * * *